(12) United States Patent
Lin

(10) Patent No.: US 9,715,429 B1
(45) Date of Patent: Jul. 25, 2017

(54) DECODING METHOD, MEMORY STORAGE DEVICE AND MEMORY CONTROL CIRCUIT UNIT

(71) Applicant: PHISON ELECTRONICS CORP., Miaoli (TW)

(72) Inventor: Wei Lin, Taipei (TW)

(73) Assignee: PHISON ELECTRONICS CORP., Miaoli (TW)

( * ) Notice: Subject to any disclaimer, the term of this patent is extended or adjusted under 35 U.S.C. 154(b) by 0 days.

(21) Appl. No.: 15/249,487

(22) Filed: Aug. 29, 2016

(30) Foreign Application Priority Data

Jul. 7, 2016 (TW) .................................. 105121544

(51) Int. Cl.
| | | |
|---|---|---|
| G11C 11/34 | (2006.01) | |
| G06F 11/10 | (2006.01) | |
| G11C 16/26 | (2006.01) | |
| G11C 16/10 | (2006.01) | |
| G11C 29/52 | (2006.01) | |
| G06F 3/06 | (2006.01) | |

(52) U.S. Cl.
CPC .......... *G06F 11/1068* (2013.01); *G06F 3/064* (2013.01); *G06F 3/0619* (2013.01); *G06F 3/0679* (2013.01); *G11C 16/10* (2013.01); *G11C 16/26* (2013.01); *G11C 29/52* (2013.01)

(58) Field of Classification Search
CPC .. G06F 11/1068; G06F 3/0679; G06F 3/0619; G06F 3/064; G11C 16/26; G11C 16/10; G11C 29/52
See application file for complete search history.

(56) References Cited

U.S. PATENT DOCUMENTS

| | | | | |
|---|---|---|---|---|
| 2014/0281770 A1* | 9/2014 | Kim | .................... | G06F 11/1068 714/721 |
| 2015/0085571 A1* | 3/2015 | Hu | .......................... | G11C 16/26 365/185.03 |
| 2015/0178154 A1* | 6/2015 | Kim | .................... | G06F 11/1048 714/758 |

\* cited by examiner

*Primary Examiner* — Pho M Luu
*Assistant Examiner* — Mohammed A Bashar
(74) *Attorney, Agent, or Firm* — Jianq Chyun IP Office

(57) ABSTRACT

A decoding method, a memory storage device and a memory control circuit unit are provided. The decoding method includes: reading first data from a plurality of first memory cells of a rewritable non-volatile memory module based on a first read voltage level and performing a first decoding operation; estimating a channel status of the rewritable non-volatile memory module and obtaining a second read voltage level according to the channel status if the first decoding operation fails, and the second read voltage level is different from the first read voltage level, and the second read voltage level is different from an optimal read voltage level; and reading second data from the plurality of first memory cells based on the second read voltage level and performing a second decoding operation. Therefore, an encoding efficiency can be improved.

24 Claims, 12 Drawing Sheets

DECODING METHOD, MEMORY STORAGE DEVICE AND MEMORY CONTROL CIRCUIT UNIT

CROSS-REFERENCE TO RELATED APPLICATION

This application claims the priority benefit of Taiwan application serial no. 105121544, filed on Jul. 7, 2016. The entirety of the above-mentioned patent application is hereby incorporated by reference herein and made a part of this specification.

BACKGROUND

1. Technology Field

The disclosure relates to a decoding technology, and more particularly, to a decoding method, a memory storage device and a memory control circuit unit.

2. Description of Related Art

The markets of digital cameras, cellular phones, and MP3 players have expanded rapidly in recent years, resulting in escalated demand for storage media by consumers. The characteristics of data non-volatility, low power consumption, compact size, and mechanical structure-free make a rewritable non-volatile memory module (e.g., a flash memory) ideal to be built in the portable multi-media devices as cited above.

In some memory devices supporting error correction, data will first be encoded and then be stored. In general, when the data read from the memory device is decoded, the memory device may check different read voltages one by one through table searching or directly track the optimal read voltage and then repeatedly read the memory cell array through adjusted read voltages if the decoding fails, so as to try to reduce the error in the data to be decoded. However, when the channel status of the memory device is poor, blindly testing different read voltages through table searching or tracking the optimum read voltage both take up a lot of time, so the decoding efficiency of the memory device is decreased.

Nothing herein should be construed as an admission of knowledge in the prior art of any portion of the present disclosure. Furthermore, citation or identification of any document in this application is not an admission that such document is available as prior art to the present disclosure, or that any reference forms a part of the common general knowledge in the art.

SUMMARY

The disclosure provides a decoding method, a memory storage device and a memory control circuit unit, which are capable of increasing the decoding efficiency.

An exemplary embodiment of the disclosure provides a decoding method for a rewritable non-volatile memory module including a plurality of memory cells, the decoding method includes: reading first data from a plurality of first memory cells among the plurality of memory cells based on a first read voltage level; performing a first decoding operation on the first data; estimating a channel status of the rewritable non-volatile memory module and obtaining a second read voltage level according to the channel status if the first decoding operation fails, wherein the second read voltage level is different from the first read voltage level, and the second read voltage level is different from an optimal read voltage level; reading second data from the plurality of first memory cells based on the second read voltage level; and performing a first decoding operation on the first data.

Another exemplary embodiment of the disclosure provides a memory storage device, which includes a connection interface unit, a rewritable non-volatile memory module and a memory control circuit unit. The connection interface unit is configured to couple to a host system. The rewritable non-volatile memory module includes a plurality of memory cells. The memory control circuit unit is coupled to the connection interface unit and the rewritable non-volatile memory module, wherein the memory control circuit unit is configured to transmit a first read command sequence which instructs reading data from a plurality of first memory cells among the plurality of memory cells based on a first read voltage level, wherein the memory control circuit unit is further configured to perform a first decoding operation on the first data, wherein the memory control circuit unit is further configured to estimate a channel status of the rewritable non-volatile memory module and obtaining a second read voltage level according to the channel status if the first decoding operation fails, wherein the second read voltage level is different from the first read voltage level, and the second read voltage level is different from an optimal read voltage level, wherein the memory control circuit unit is further configured to transmit a second read command sequence which instructs reading second data from the plurality of first memory cells based on the second read voltage level, wherein the memory control circuit unit is further configured to perform a first decoding operation on the first data.

Another exemplary embodiment of the disclosure provides a memory control circuit unit, which is configured to control a rewritable non-volatile memory module including a plurality of memory cells, and the memory control circuit unit includes a host interface, a memory interface, an error checking and correcting circuit, and a memory management circuit. The host interface is configured to couple to a host system. The memory interface is configured to couple to the rewritable non-volatile memory module. The memory management circuit is coupled to the host interface, the memory interface, and the error checking and correcting circuit, wherein the memory management circuit is configured to transmit a first read command sequence which instructs reading first data from a plurality of first memory cells among the plurality of memory cells based on a first read voltage level, wherein the error checking and correcting circuit is configured to perform a first decoding operation on the first data, wherein the memory management circuit is further configured to estimate a channel status of the rewritable non-volatile memory module and obtaining a second read voltage level according to the channel status if the first decoding operation fails, wherein the second read voltage level is different from the first read voltage level, and the second read voltage level is different from an optimal read voltage level, wherein the memory management circuit is further configured to transmit a second read command sequence which instructs reading second data from the plurality of first memory cells based on the second read voltage level, wherein the error checking and correcting circuit is further configured to perform a second decoding operation on the second data.

Based on the above, when the first data is read based on the first read voltage level and the first decoding operation performed on the first data fails, the second read voltage level different from the first read voltage level can be obtained according to the estimated channel status of the rewritable non-volatile memory module, and the second read voltage level is different from the optimal read voltage level. Then, the second data is read based on the second read voltage level and the second decoding operation is performed. Particularly, the determination of the second read voltage level approximately corresponds with current channel status of the rewritable non-volatile memory module, so compared to strictly tracking the optimal read voltage level, the second read voltage level can be determined more quickly. In addition, compared to the first read voltage level, the error in the data which is read based on the second read voltage level can also be reduced. In such a way, the decoding efficiency of the memory storage device can be increased.

It should be understood, however, that this Summary may not contain all of the aspects and embodiments of the present disclosure, is not meant to be limiting or restrictive in any manner, and that the disclosure as disclosed herein is and will be understood by those of ordinary skill in the art to encompass obvious improvements and modifications thereto.

To make the above features and advantages of the disclosure more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
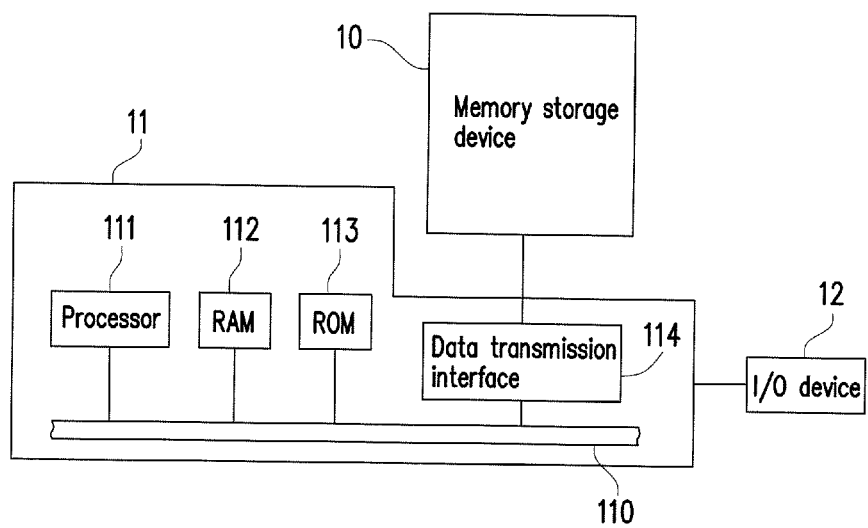
FIG. 1 is a schematic diagram illustrating a host system, a memory storage device and an I/O (input/output) device according to an exemplary embodiment of the disclosure.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present disclosure may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Generally, the memory storage device (also known as a memory storage system) includes a rewritable non-volatile memory module and a controller (also known as a control circuit). The memory storage device is usually configured together with a host system so that the host system may write data into the memory storage device or read data from the memory storage device.

FIG. 1 is a schematic diagram illustrating a host system, a memory storage device and an I/O (input/output) device according to an exemplary embodiment of the disclosure.

Figure 2:
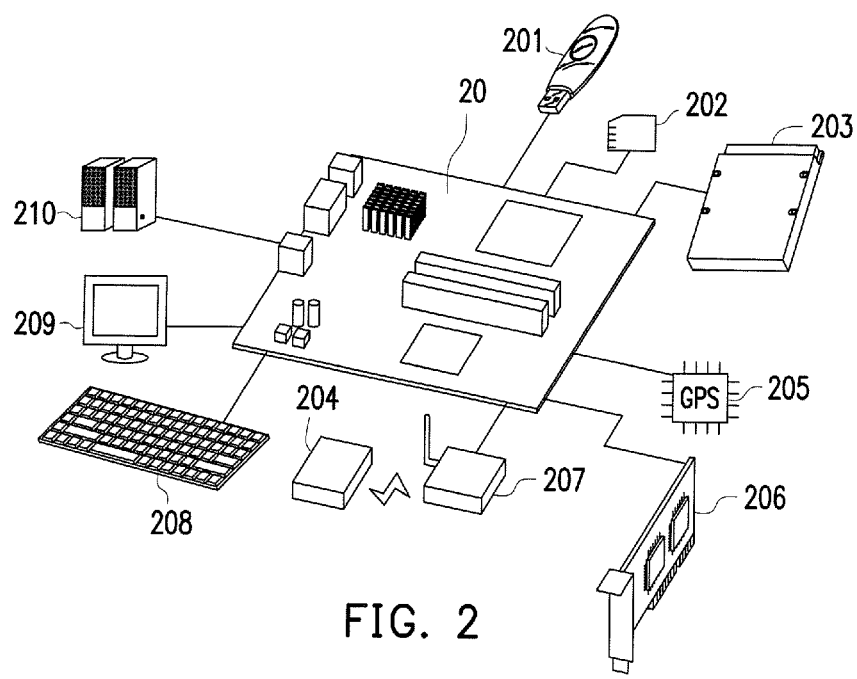
FIG. 2 is a schematic diagram illustrating a host system, a memory storage device and an I/O device according to another exemplary embodiment of the disclosure.

FIG. 2 is a schematic diagram illustrating a host system, a memory storage device and an I/O device according to another exemplary embodiment of the disclosure.

Referring to FIG. 1 and FIG. 2, a host system 11 generally includes a processor 111, a RAM (random access memory) 112, a ROM (read only memory) 113 and a data transmission interface 114. The processor 111, the RAM 112, the ROM 113 and the data transmission interface 114 are coupled to a system bus 110.

In the present exemplary embodiment, the host system 11 is coupled to a memory storage device 10 through the data transmission interface 114. For example, the host system 11 can store data into the memory storage device 10 or read data from the memory storage device 10 through the data transmission interface 114. Further, the host system 11 is coupled to an I/O device 12 through the system bus 110. For example, the host system 11 can transmit output signals to the I/O device 12 or receive input signals from I/O device 12 through the system bus 110.

In the present exemplary embodiment, the processor 111, the RAM 112, the ROM 113 and the data transmission interface 114 may be disposed on a main board 20 of the host system 11. The number of the data transmission interface 114 may be one or more. Through the data transmission interface 114, the main board 20 may be coupled to the memory storage device 10 in a wired manner or a wireless manner. The memory storage device 10 may be, for example, a flash drive 201, a memory card 202, a SSD (Solid Status Drive) 203 or a wireless memory storage device 204. The wireless memory storage device 204 may be, for example, a memory storage device based on various wireless communication technologies, such as a NFC (Near Field Communication) memory storage device, a WiFi (Wireless Fidelity) memory storage device, a Bluetooth memory storage device, a Bluetooth low energy memory storage device (e.g., iBeacon). Further, the main board 20 may also be coupled to various I/O devices including a GPS (Global Positioning System) module 205, a network interface card 206, a wireless transmission device 207, a keyboard 208, a monitor 209 and a speaker 210 through the system bus 110. For example, in an exemplary embodiment, the main board 20 may access the wireless memory storage device 204 through the wireless transmission device 207.

Figure 3:
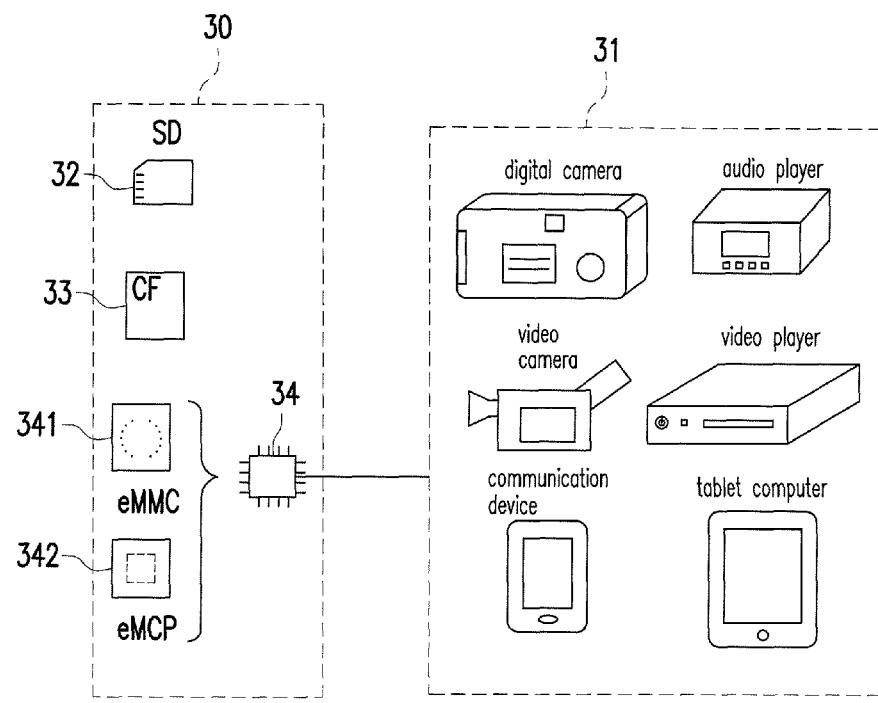
FIG. 3 is a schematic diagram illustrating a host system and a memory storage device according to another exemplary embodiment of the disclosure.

In an exemplary embodiment, aforementioned host system may be any system capable of substantially cooperating with the memory storage device for storing data. The host system is illustrated as a computer system in foregoing exemplary embodiment; nonetheless, FIG. 3 is a schematic diagram illustrating a host system and a memory storage device according to another exemplary embodiment of the disclosure. Referring to FIG. 3, a host system 31 may also be a system including a digital camera, a video camera, a communication device, an audio player, a video player or a tablet computer in another exemplary embodiment, whereas a memory storage device 30 may be various non-volatile memory devices used by the host system 31, such as a SD (Secure Digital) card 32, a CF (Compact Flash) card 33 or an embedded storage device 34. The embedded storage device 34 includes various embedded storage devices capable of directly coupling a memory module onto a substrate of the host system 31, such as an eMMC (embedded Multi Media Card) 341 and/or an eMCP (embedded Multi Chip Package) storage device 342.

Figure 4:
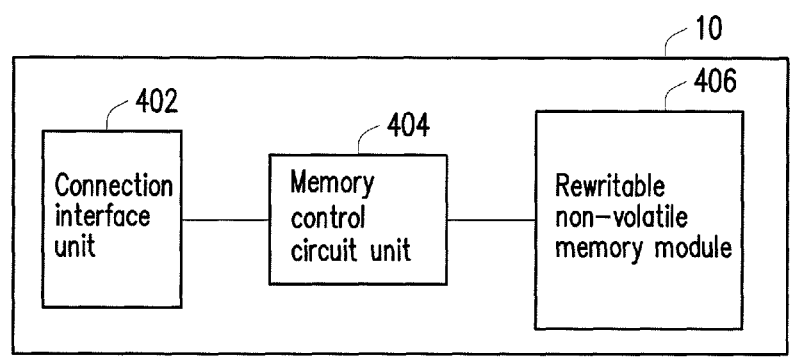
FIG. 4 is a schematic block diagram illustrating a memory storage device according to an exemplary embodiment of the disclosure.

FIG. 4 is a schematic block diagram illustrating a memory storage device according to an exemplary embodiment of the disclosure.

Referring to FIG. 4, the memory storage device 10 includes a connection interface unit 402, a memory control circuit unit 404 and a rewritable non-volatile memory module 406.

The connection interface unit is configured to couple the memory storage device 10 to the host system 11. In the present exemplary embodiment, the connection interface unit 402 is compatible with a SATA (Serial Advanced Technology Attachment) standard. Nevertheless, it should be understood that the disclosure is not limited thereto. The connection interface unit 402 may also be compatible to a PATA (Parallel Advanced Technology Attachment) standard, an IEEE (Institute of Electrical and Electronic Engineers) 1394 standard, a PCI Express (Peripheral Component Interconnect Express) interface standard, a USB (Universal Serial Bus) standard, a SD interface standard, a UHS-I (Ultra High Speed-I) interface standard, a UHS-II (Ultra High Speed-II) interface standard, a MS (Memory Stick) interface standard, a MCP interface standard, a MMC interface standard, an eMMC interface standard, a UFS (Universal Flash Storage) interface standard, an eMCP interface standard, a CF interface standard, an IDE (Integrated Device Electronics) interface standard or other suitable standards. The connection interface unit 402 and the memory control circuit unit 404 may be packaged into one chip, or the connection interface unit 402 is distributed outside of a chip containing the memory control circuit unit 404.

The memory control circuit unit 404 is configured to execute a plurality of logic gates or control commands which are implemented in a hardware form or in a firmware form and perform operations of writing, reading or erasing data in the rewritable non-volatile memory storage module 406 according to the commands of the host system 11.

The rewritable non-volatile memory module 406 is coupled to the memory control circuit unit 404 and configured to store data written from the host system 11. The rewritable non-volatile memory module 406 may be a SLC (Single Level Cell) NAND flash memory module (i.e., a flash memory module capable of storing one bit in one memory cell), a MLC (Multi Level Cell) NAND flash memory module (i.e., a flash memory module capable of storing two bits in one memory cell), a TLC (Triple Level Cell) NAND flash memory module (i.e., a flash memory module capable of storing three bits in one memory cell), other flash memory modules or any memory module having the same features.

The memory cells in the rewritable non-volatile memory module 406 are disposed in array. The 2-dimensional array and the 3-dimensional array are used for illustration respectively in the memory cell array of the different exemplary embodiments in the following paragraphs. It should be noted that the following exemplary embodiments are merely several examples of memory cell array. In other exemplary embodiments, the configuration of the memory cell array can be adjusted to meet the practical requirements.

Figure 5A:
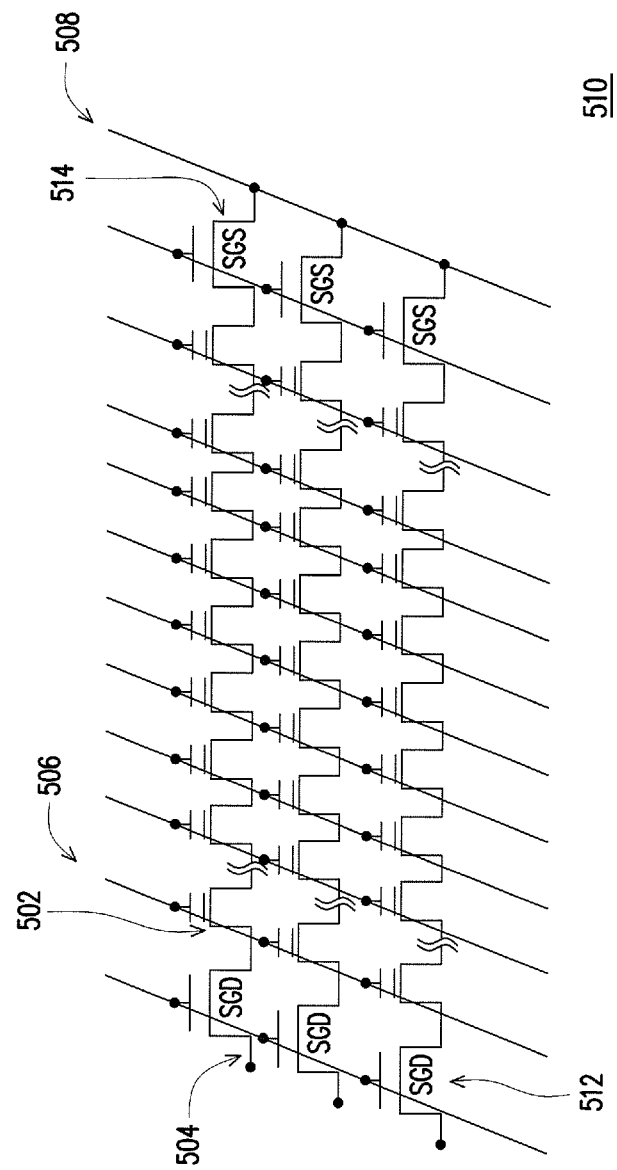
FIG. 5A is a schematic diagram illustrating a memory cell array according to an exemplary embodiment of the disclosure.

FIG. 5A is a schematic diagram illustrating a memory cell array according to an exemplary embodiment of the disclosure.

Please referring to FIG. 5A, the memory cell array 510 includes a plurality of memory cells 502 for storing data, a plurality of select gate drain (SGD) transistors 512, a plurality of select gate source (SGS) transistors 514, a plurality of bit lines 504, a plurality of word lines 506, and a common source line 508 connected to the memory cells 502. The memory cells 502 are disposed on the intersections of bit lines 504 and the word lines 506 in an array, as illustrated in FIG. 5A.

Figure 5B:
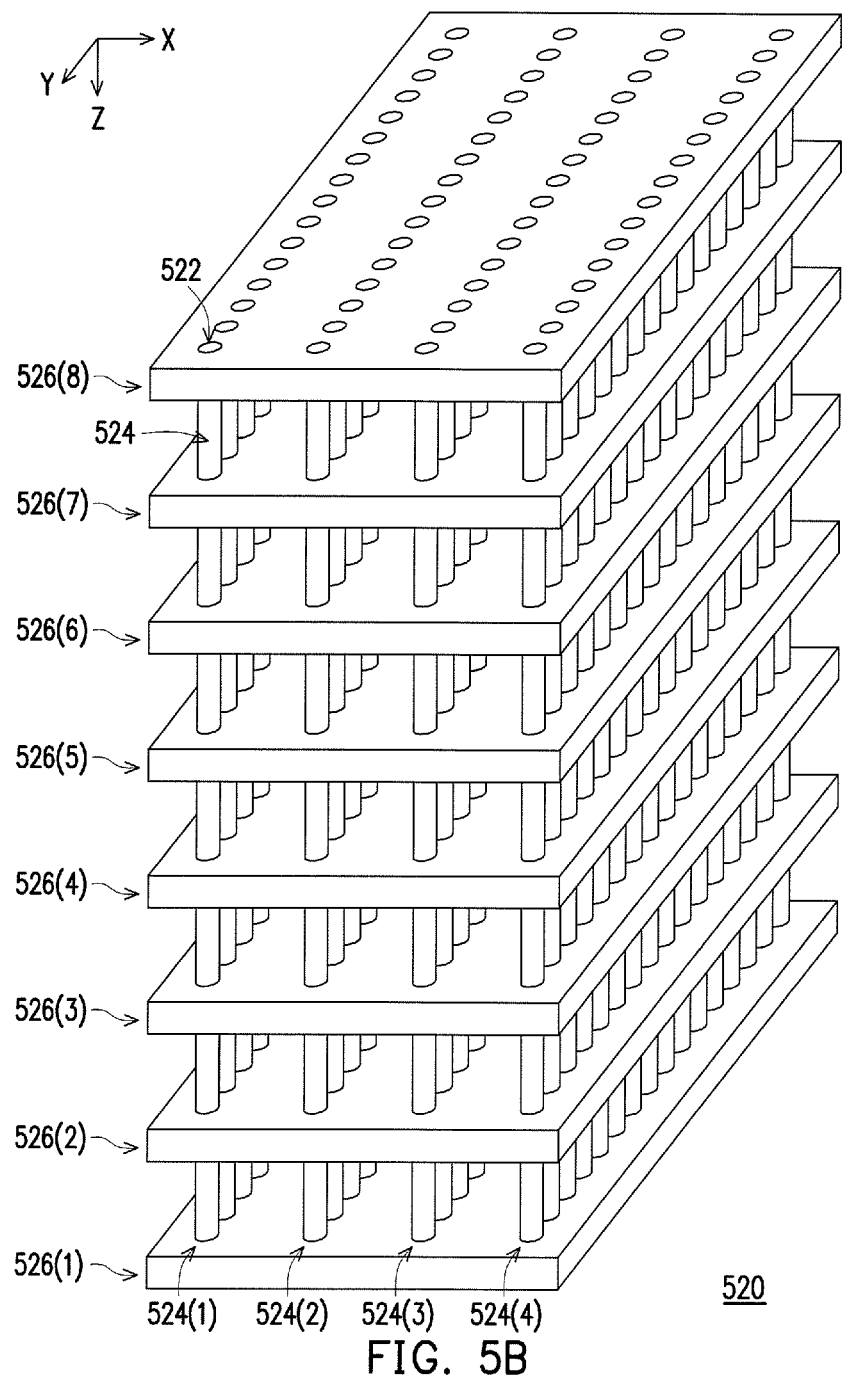
FIG. 5B is a schematic diagram illustrating another memory cell array according to an exemplary embodiment of the disclosure.

FIG. 5B is a schematic diagram illustrating another memory cell array according to an exemplary embodiment of the disclosure.

Please referring to FIG. 5B, the memory cell array 520 includes a plurality of memory cells 522 for storing data, a plurality of bit line groups 524(1)~524(4), and a plurality of word line layers 526(1)~526(8). The bit line groups 524(1)~524(4) are independent from each other (for example, separated from each other) and arranged along a first direction (e.g., X-axis). Each bit line group among the bit line groups 524(1)~524(4) includes a plurality of bit line 524 independent from each other (e.g., separated from each other). The bit line 524 included in each bit line group is arranged along a second direction (e.g., Y-axis) and extended along a third direction (e.g., Z axis). Word line layers 526(1)~526(8) are independent from each other (e.g., separated from each other) and are stacked along the third direction. In the present exemplary embodiment, each word line layer of the word line layers 526(1)~526(8) can also be regarded as a word line plane. Each memory cell 522 is disposed on the intersection of each bit line 524 of the bit line groups 524(1)~524(4) and each of the word line layers 526(1)~526(8). However, in another exemplary embodiment, a bit line group can include more or less bit lines, and a word line layer can let more or less bit line groups pass by.

Each of the memory cells in the rewritable non-volatile memory module 406 stores one or more bits based on a voltage (hereinafter, also known as a threshold voltage) change. When a write command sequence or read command sequence are received from the memory control circuit unit 404, the rewritable non-volatile memory module 406 controls the voltage applied on a word line (or word line layer) and a bit line (or bit line group) to change the threshold voltage of the corresponding memory cell or detecting the status of the memory cell. For example, in each of the memory cells, a charge trapping layer is provided between a control gate and a channel. Amount of electrons in the charge trapping layer may be changed by applying a write voltage (or programming voltage) to the control gate of a memory cell thereby changing the threshold voltage of the memory cell. For example, this operation of changing the threshold voltage is also known as "writing data into the memory cell" or "programming the memory cell". With changes in the threshold voltage, the memory cells in the rewritable non-volatile memory module 406 can has a plurality of states. The state to which the memory cell belongs may be determined by applying a read voltage, so as to obtain the one or more bits stored in the memory cell.

The memory cells of the rewritable non-volatile memory module 406 constitute a plurality of physical programming units, and the physical programming units constitute a plurality of physical erasing units. For example, the memory cells on the same word line or word line layer can form into one physical programming unit or a plurality of physical programming units. For example, if the rewritable non-volatile memory module 406 is MLC NAND type flash memory module, the memory cells on the intersections of a plurality of bit lines and the same word line (or word line layer) can form into two physical programming units. Alternatively, if the rewritable non-volatile memory module 406 is TLC NAND type flash memory module, the memory cells on the intersections of a plurality of bit lines and the same word line (or word line layer) can form into three physical programming units.

In the present exemplary embodiment, the physical programming unit is a minimum unit for programming. That is, the physical programming unit is the minimum unit for writing data. For example, the physical programming unit is a physical page or a physical sector. If a physical programming unit is a physical page, the physical programming unit normally includes data bit region and redundancy bit region, wherein the data bit region includes a plurality of physical sectors for storing user data, and the redundancy bit region is for storing system data (error correction code, for example). In this exemplary embodiment, a data bit region includes 32 physical sectors, and the size of each physical sector is 512 bytes (B). However, in other exemplary embodiments, a data bit area may also include 8, 16 physical sectors or different number (more or less) of the physical sectors, and the size of each physical sector may also be greater or smaller. On the other hand, the physical erasing unit is the minimal unit for erasing. Namely, each physical erasing unit contains the least number of memory cells to be erased together. For instance, the physical erasing unit is a physical block.

Figure 6:
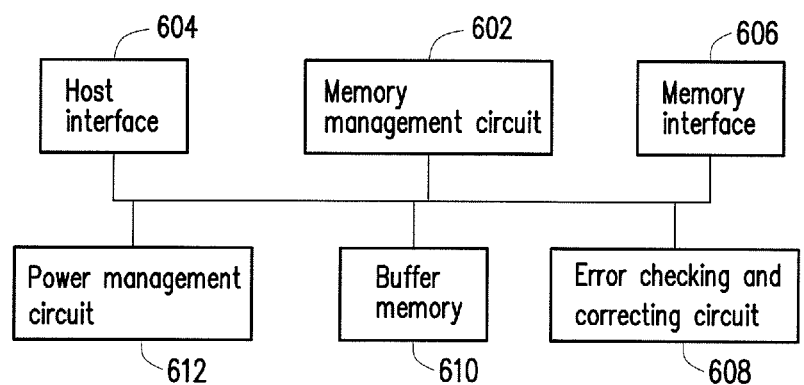
FIG. 6 is a schematic block diagram illustrating a memory control circuit unit according to an exemplary embodiment of the disclosure.

FIG. 6 is a schematic block diagram illustrating a memory control circuit unit according to an exemplary embodiment of the disclosure.

Referring to FIG. 6, the memory control circuit unit 404 includes a memory management circuit 602, a host interface 604, a memory interface 606 and an error checking and correcting circuit 608.

The memory management circuit 602 is configured to control overall operations of the memory control circuit unit 404. Specifically, the memory management circuit 602 has a plurality of control commands. When the memory storage device 10 is operated, the control commands are performed to perform various operations such as data writing, data reading, data erasing, adjusting read voltage and so on. Hereinafter, description for operations of the memory management circuit 602 is equivalent to description for operations of the memory control circuit unit 404.

In the present exemplary embodiment, the control commands of the memory management circuit 602 are implemented in form of firmware. For instance, the memory management circuit 602 has a microprocessor unit (not illustrated) and a ROM (not illustrated), and the control commands are burned into the ROM. When the memory storage device 10 is operated, the control commands are performed by the microprocessor unit for performing various operations, such as data writing, data reading, data erasing, and adjusting read voltage.

In another exemplary embodiment, the control commands of the memory management circuit 602 may also be stored as program codes in a specific area (for example, the system area in a memory module exclusively used for storing system data) of the rewritable non-volatile memory module 406. In addition, the memory management circuit 602 has a microprocessor unit (not illustrated), the read only memory (not illustrated) and a random access memory (not illustrated). In particular, the read-only memory has a boot code. When the memory controlling circuit unit 404 is enabled (power-on, for example), the boot code is first performed by the microprocessor unit for loading the control commands stored in the rewritable non-volatile memory module 406 to the random access memory of the memory management circuit 602. Afterwards, the microprocessor unit performs the control commands for various operations such as data writing, data reading, data erasing, and adjusting the read voltage.

Further, in another exemplary embodiment, the control commands of the memory management circuit 602 may also be implemented in a form of hardware. For example, the memory management circuit 602 includes a microprocessor, a memory cell management circuit, a memory writing circuit, a memory reading circuit, a memory erasing circuit, a read voltage control circuit, and a data processing circuit. The memory cell management circuit, the memory writing circuit, the memory reading circuit, the memory erasing circuit, the read voltage control circuit, and the data processing circuit are coupled to the microprocessor. The memory cell management circuit is configured to manage the memory cells or a group thereof. The memory writing circuit is configured to issue a write command sequence for the rewritable non-volatile memory module 406 in order to write data into the rewritable non-volatile memory module 406. The memory reading circuit is configured to issue a read command sequence for the rewritable non-volatile memory module 406 in order to read data from the rewritable non-volatile memory module 406. The memory erasing circuit is configured to issue an erase command sequence for the rewritable non-volatile memory module 406 in order to erase data from the rewritable non-volatile memory module 406. The read voltage control circuit is configured to issue a read voltage control command sequence to control the read voltage level for the rewritable non-volatile memory module 406 to read data. The data processing circuit is configured to process both the data to be written into the rewritable non-volatile memory module 406 and the data read from the rewritable non-volatile memory module 406. Each of the write command sequence, the read command sequence, the erase command sequence, and the read voltage control command sequence may include one or more program codes or command codes, respectively, and instruct the rewritable non-volatile memory module 406 to perform the corresponding operations, such as data writing, data reading, data erasing, and read voltage adjusting. In an exemplary embodiment, the memory management circuit 602 may further issue command sequences of other types to the rewritable non-volatile memory module 406 for instructing to perform the corresponding operations.

The host interface 604 is coupled to the memory management circuit 602 and configured to receive and identify commands and data sent from the host system 11. In other words, the commands and data sent from the host system 11 are passed to the memory management circuit 602 through the host interface 604. In the present exemplary embodiment, the host interface 604 is compatible with the SATA standard. However, it should be understood that the present disclosure is not limited thereto, and the host interface 604 may also be compatible with the PATA standard, the IEEE 1394 standard, the PCI Express standard, the USB standard, the SD standard, the UHS-I standard, the UHS-II standard, the MS standard, the MMC standard, the eMMC standard, the UFS standard, the CF standard, the IDE standard, or other suitable standards for data transmission.

The memory interface 606 is coupled to the memory management circuit 602 and configured to access the rewritable non-volatile memory module 406. That is, data to be written to the rewritable non-volatile memory module 406 is converted to a format acceptable to the rewritable non-volatile memory module 406 through the memory interface 606. Specifically, if the memory management circuit 602 intends to access the rewritable non-volatile memory module 406, the memory interface 606 transmits corresponding command sequences. For example, the command sequences may include the write command sequence which instructs to write data, the read command sequence which instructs to read data, the erase command sequence which instructs to erase data, and the read voltage control command sequences which indicates a read voltage level for reading data, and the type of the command sequences able to be transmitted by the memory interface 606 is not limited to the above. These command sequences are generated by the memory management circuit 602 and transmitted to the rewritable non-volatile memory module 406 through the memory interface 606, for example. The command sequences may include one or more signals, or data on the bus. The signals or the data may include command codes and programming codes. For example, in a read command sequence, information such as identification codes and memory addresses are included.

The error checking and correcting circuit 608 is coupled to the memory management circuit 602 and configured to perform an error checking and correcting process to ensure correctness of the data. Specifically, when the memory management circuit 602 receives the write command from the host system 11, the error checking and correcting circuit 608 generates an ECC (error correcting code) and/or an EDC (error detecting code) for data corresponding to the write command, and the memory management circuit 602 writes data corresponding to the write command and the ECC and/or the EDC into the rewritable non-volatile memory module 406. Later, the memory management circuit 602 simultaneously reads the ECC and/or the EDC corresponding to the data when the data is read from the rewritable non-volatile memory module 406, and the error checking and correcting circuit 608 performs the error checking and correcting process on the read data based on the ECC and/or the EDC. For example, the error checking and correcting circuit 608 may use the algorithms such as the low density parity code (LDPC), BCH code or block turbo code (BTC) for performing the encoding and decoding operation.

In an exemplary embodiment, the memory control circuit unit 404 further includes a buffer memory 610 and a power management circuit 612.

The buffer memory 610 is coupled to the memory management circuit 602 and configured to temporarily store data and commands from the host system 11 or data from the rewritable non-volatile memory module 406. The power management unit 612 is coupled to the memory management circuit 602 and configured to control a power of the memory storage device 10.

In the present exemplary embodiment, the memory management circuit 602 configures logical unit for mapping to the physical units in the rewritable non-volatile memory module 406. For instance, one logical unit may refer to one logical address, one logical programming unit, one logical erasing unit, or may be constituted by a plurality of consecutive or non-consecutive logical addresses. For instance, one physical unit may refer to one physical address, one physical programming unit, one physical erasing unit, or may be constituted by a plurality of consecutive or non-consecutive physical addresses. In addition, one logical unit may be mapped to one or more physical units. For instance, the memory management circuit 602 records a mapping relationship (also known as a logical-to-physical address mapping relationship) between the logical units and the physical units into at least one logical-to-physical address mapping table. When the host system 11 intends to read data from the memory storage device 10 or write data into the memory storage device 10, the memory management circuit 602 may perform the data access on the memory storage device 10 according to the logical-to-physical address mapping table.

It is noted that in the following description, some terms may be replaced with corresponding abbreviations for ease of reading (seeing table 1).

TABLE 1

| | |
|---|---|
| logical-to-physical address mapping table | L2P table |
| physical address-Logical address mapping table | P2L table |
| rewritable non-volatile memory module | RNVM module |
| physical unit | PU |
| physical erasing unit | PEU |
| physical programming unit | PPU |
| logical unit | LU |
| logical erasing unit | LEU |
| logical programming unit | LPU |
| memory management circuit | MMC |
| memory control circuit unit | MCCU |
| error checking and correcting circuit | ECCC |

Figure 7A:
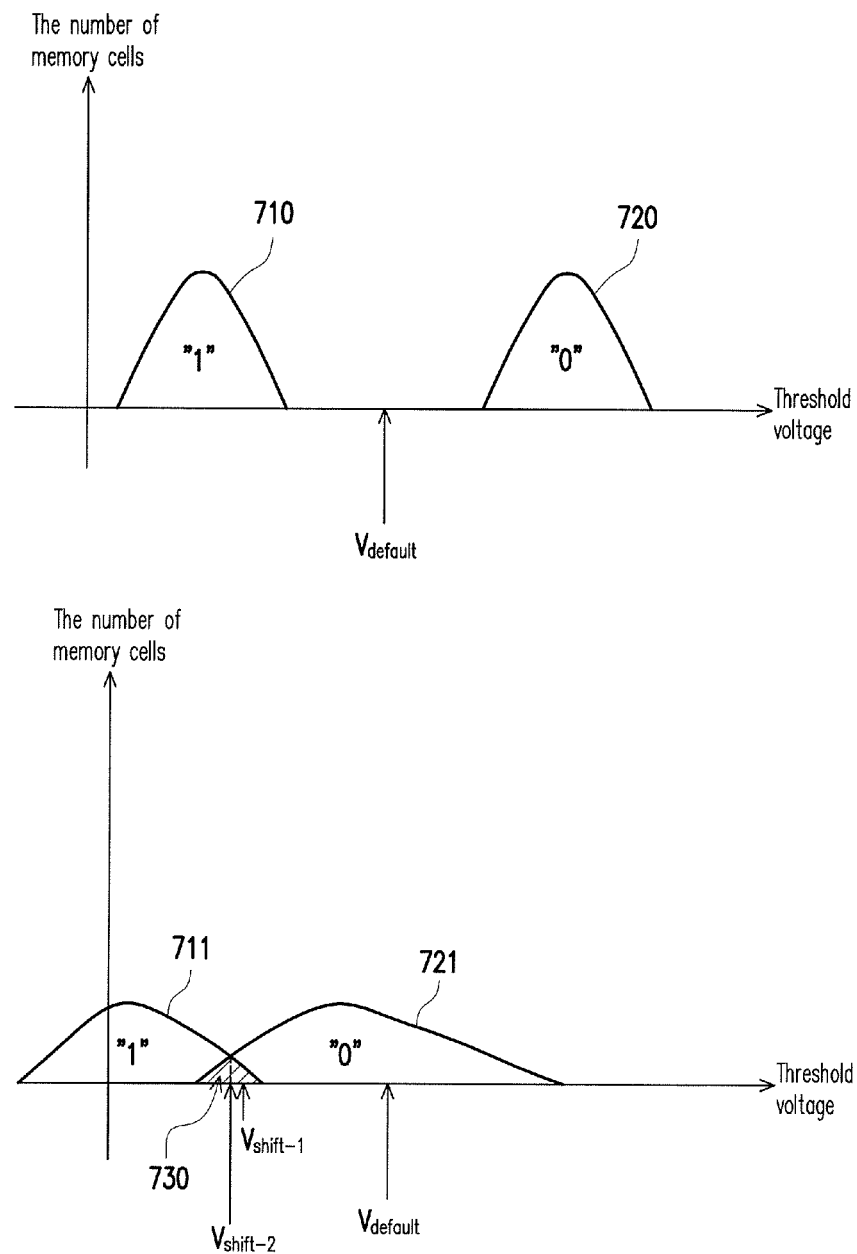
FIG. 7A is a schematic diagram illustrating a threshold voltage distribution of memory cells according to an exemplary embodiment of the disclosure.

FIG. 7A is a schematic diagram illustrating a threshold voltage distribution of memory cells according to an exemplary embodiment of the disclosure. It is noted that FIG. 7A illustrates a threshold voltage distribution of the programmed memory cell (hereinafter also referred to as first memory cell) after one PU or a plurality of PUs of the RNVM module 406 are programmed, wherein the horizontal axis represents the threshold voltages of the memory cells, and the vertical axis represents the number of the memory cells.

Please referring to FIG. 7A, in the present exemplary embodiment, if the threshold voltage of one specific memory cell belongs to the state 710, the bit stored by the specific memory cell is the bit "1"; otherwise, it the threshold voltage of one specific memory cell belongs to the state 720, the bit stored by the specific memory cell is the bit "0". It is noted that in the present exemplary embodiment, each memory cell is configured to store one bit, so the threshold voltage distribution has two states. In the following exemplary embodiments, the case that each memory cell storing one bit is also used as an example. However, in other exemplary embodiments (not shown), if one memory cell is configured to store multiple bits, the corresponding threshold voltage distribution may have four, eight or any number of possible states. In addition, the bit represented by each state on the threshold voltage distribution is not particularly limited by the disclosure.

When the data is going to be read from the RNVM module 406, the MMC 602 transmits a read command sequence (hereinafter also referred to as first read command sequence) to the RNVM module 406, wherein the first read command sequence instructs the RNVM module 406 to read the data (hereinafter also referred to as first data) from the first memory cells based on one specific read voltage level (hereinafter also referred to as first read voltage level). For instance, the first read command sequence includes the read voltage control command sequence corresponding to the first read voltage level. According to the first read command sequence, the RNVM module 406 uses a read voltage $V_{default}$ corresponding to the first read voltage level to read the first memory cells and transmits the corresponding bit data to the MMC 602. For instance, if the threshold voltage of one specific memory cell is lower than the read voltage $V_{default}$ (for example, the memory cells belong to the distribution 710), the MMC 602 reads bit "1"; otherwise, if the threshold voltage of one specific memory cell is higher than the read voltage $V_{default}$ (for example, the memory cells belong to the distribution 720), the MMC 602 reads bit "0".

However, with the increase of the time of using the RNVM module 406 and/or the change of the operation environment, the performance degradation may occur on these first memory cells. After the occurrence of the performance degradation on the first memory cells, state 710 and state 720 may get closer to each other or even overlap with each other. For instance, state 711 and state 721 illustrate the threshold voltage distribution of the first memory cells after the performance degradation occurs. After the occurrence of the performance degradation, if the read voltage $V_{default}$ is still used to read these first memory cells, many memory cells storing bit "0" (that is, memory cell belonging to state 721 but with a threshold voltage less than the read voltage $V_{default}$) will be misjudged as memory cells storing bit "1" In other words, in correspondence with state 711 and state 721, if the first memory cell is consistently read based on the first read voltage level, the obtained first data may include many error bits.

After the first data is obtained, the ECCC 608 may perform a decoding operation (hereinafter also referred to as first decoding operation) on the first data. If the first decoding operation succeeds (for instance, all of the errors in the first data are corrected), the MMC 602 outputs the successfully decoded data. If the first decoding operation fails (for instance, the errors in the first data cannot be totally corrected), the MMC 602 estimates the channel status of the RNVM module 406 and obtains another read voltage level (hereinafter also referred to as second read voltage level) according to the estimated channel status, wherein the second read voltage level is different from the first read voltage level, and the second read voltage level is different from an optimal read voltage level.

Please referring to FIG. 7A again, if the first decoding operation fails, the MMC 602 roughly estimates the channel status of the first memory cells, where the channel status roughly reflects the state 711 and state 721. By the estimated channel status, the second read voltage level corresponding to the read voltage $V_{shift-1}$ can be determined, wherein the read voltage $V_{shift-1}$ is different from the read voltage $V_{default}$. For instance, the read voltage $V_{shift-1}$ may be located in the overlapping region 730 between state 711 and state 721. However, in another exemplary embodiment, the read voltage $V_{shift-1}$ may not locate in the overlapping region 730, the disclosure is not limited thereto.

After the second read voltage level is obtained, the MMC 602 transmits a read command sequence (hereinafter also referred to as second read command sequence) to the RNVM module 406, wherein the second read command sequence instructs the RNVM module 406 to read data (hereinafter also referred to as second data) from the first memory cells based on the second read voltage level. For instance, the second read command sequence includes the read voltage control command sequence corresponding to the second read voltage level. For instance, according to the second read command sequence, the RNVM module 406 uses the read voltage $V_{shift-1}$ to read the first memory cells and transmits the corresponding bit data to the MMC 602. After the second data is obtained, the ECCC 608 performs a decoding operation (hereinafter also referred to as second decoding operation) on the second data.

It is noted that the second read voltage level is determined according to the roughly estimated channel status, so the second read voltage level is close to but not equal to an optimal read voltage level corresponding to the current threshold voltage distribution of the first memory cells. For instance, in FIG. 7A, if the read voltage $V_{shift-2}$ is the optimal read voltage level corresponding to the state 711 and state 721 (for instance, the read voltage $V_{shift-2}$ can be obtained by performing an optimal read voltage level tracking operation), the read voltage $V_{shift-1}$ is approach but not be equal to the read voltage $V_{shift-2}$. In addition, there is a high probability that the total number of the error bits included in the second data read by the read voltage $V_{shift-1}$ is significantly less than the total number of the error bits included in the first data read by the read voltage $V_{default}$. Therefore, even if the first decoding operation fails, the second decoding operation has a higher probability as being successful.

In an exemplary operation, the above operation of roughly estimating the channel status of the RNVM module 406 and obtaining the second read voltage level (for instance, read voltage $V_{shift-1}$) according to the estimated channel status can also be regarded as a read voltage level coarse adjustment operation. On the contrary, the optimal read voltage level tracking operation used for finding the optimal read voltage level (for instance, read voltage $V_{shift-2}$) can also be regarded as a read voltage level fine adjustment operation.

In the present exemplary embodiment, the ECCC 608 supports at least one decoding mode among a hard-bit mode decoding and a soft-bit decoding mode. For instance, in FIG. 7A, if a decoding operation belonging to the hard-bit mode decoding is performed, the read voltage $V_{default}$ and $V_{shift-1}$ can be considered to be a hard decision read voltage respectively, and the bit data read from the first memory cells by the read voltage $V_{default}$ or $V_{shift-1}$ belongs to a hard bit. Take reading the first memory cells using the read voltage $V_{shift-1}$ as an example, if the threshold voltage of one specific memory cell is lower than the read voltage $V_{shift-1}$ the MMC 602 reads a hard bit "1"; otherwise, if the threshold voltage of one specific memory cell is higher than the read voltage $V_{shift-1}$, the MMC 602 reads a hard bit "0". In the decoding operation belonging to the hard-bit mode decoding, the ECCC 608 performs the decoding operation based on the hard bits read from the memory cells.

Figure 7B:
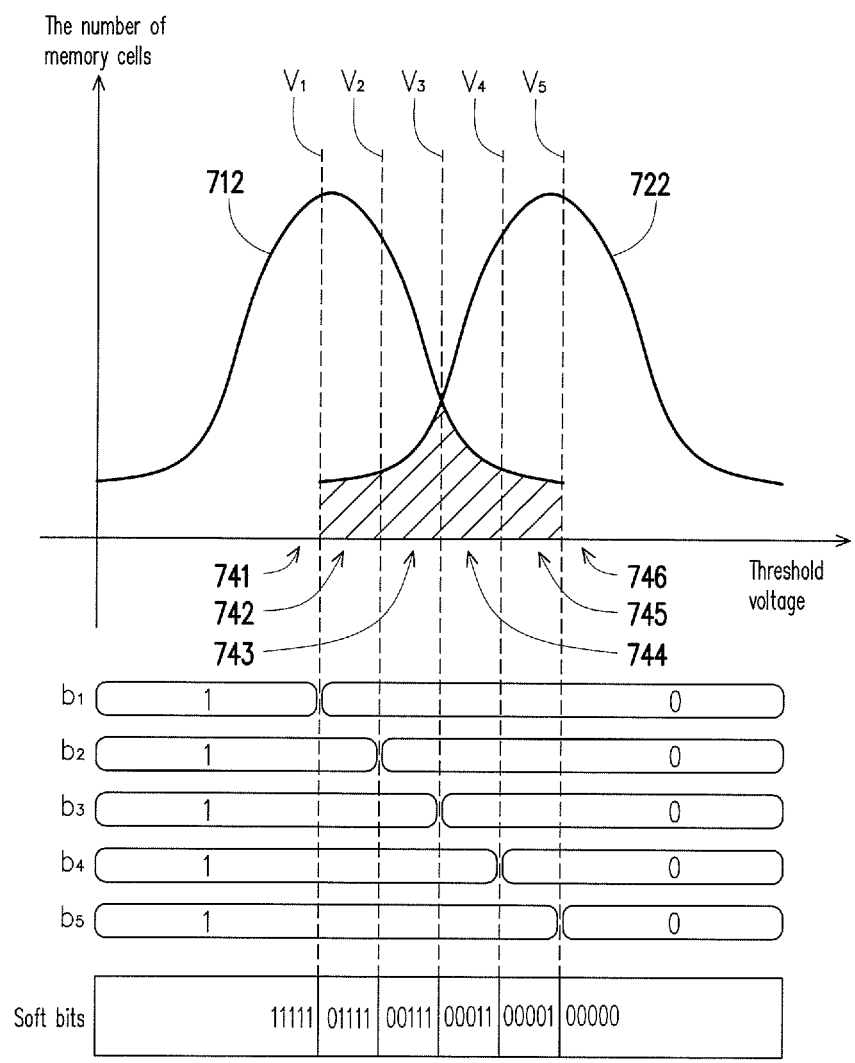
FIG. 7B is a schematic diagram illustrating the operation of reading soft bits according to an exemplary embodiment of the disclosure.

FIG. 7B is a schematic diagram illustrating the operation of reading soft bits according to an exemplary embodiment of the disclosure.

Please referring to FIG. 7B, it is supposed that the threshold voltage distribution of the first memory cells includes state 712 and state 722, wherein state 712 corresponds to bit "1", and state 722 corresponds to bit "0". If a decoding operation belonging to the soft-bit mode decoding is performed, each of the read voltages $V_1$ to $V_5$ can be regarded as a soft decision read voltage, and the read voltages $V_1$~$V_5$ will be used to read the first memory cell one by one, wherein the bit data read from the first memory cell with the usage of the read voltages $V_1$~$V_5$ are collectively called as the soft bits. For instance, if the threshold voltage of one of the specific memory cells is lower than the read voltage $V_1$ (i.e., belonging to the voltage interval 741), the MMC 602 reads the soft bits "11111"; if the threshold voltage of one of the specific memory cells is between the read voltage $V_1$ and $V_2$ (i.e., belonging to the voltage interval 742), the MMC 602 reads the soft bits "01111"; if the threshold voltage of one of the specific memory cells is between the read voltage $V_2$ and $V_3$ (i.e., belonging to the voltage interval 743), the MMC 602 reads the soft bits "00111"; if the threshold voltage of one of the specific memory cells is between the read voltage $V_3$ and $V_4$ (i.e., belonging to the voltage interval 744), the MMC 602 reads the soft bits "00011"; if the threshold voltage of one of the specific memory cells is between the read voltage $V_4$ and $V_5$ (i.e., belonging to the voltage interval 745), the MMC 602 reads the soft bits "00001"; or, if the threshold voltage of one of the specific memory cells is greater than the read voltage $V_5$ (i.e., belonging to the voltage interval 746), the MMC 602 reads the soft bits "00000". In the decoding operation belonging to the soft-bit mode decoding, the ECCC 608 performs the decoding operation based on the soft bits read from the memory cells.

In general, the channel information represented by the soft bits is greater than the channel information represented by the hard bit, so the success rate of the soft-bit mode decoding is usually higher than the success rate of the hard-bit mode decoding. However, the execution speed of the hard-bit mode decoding is faster than the execution speed of the soft-bit mode decoding. In addition, channel reliability information is also used in soft-bit mode decoding. For instance, the channel reliability information includes Log-Likelihood Ratio (LLR). The knowledge about how to use the channel reliability information such as Log-Likelihood Ratio to perform the soft-bit mode decoding belongs to generally knowledge in the art, and the detail will not be repeated herein.

In the present exemplary embodiment, the first decoding operation belongs to the hard-bit mode decoding, and the second decoding operation belongs to the soft-bit mode decoding. For instance, in FIG. 7A, after receiving the first read command sequence, the RNVM module 406 uses read voltage $V_{default}$ to read the first memory cells for obtaining the first data, wherein the first data includes hard bits used in the first decoding operation. Then, after the second read command sequence is received, the RNVM module 406 uses a plurality of read voltages including the read voltage $V_{shift-1}$ to read the first memory cells for obtaining the second data, wherein the second data includes soft bits used in the second decoding operation. Furthermore, if the RNVM module 406 uses the read voltages $V_1$~$V_5$ as illustrated in FIG. 7B to read the first memory cells for obtaining the second data, the read voltage $V_3$ at the central location of the read voltages $V_1$~$V_5$ may be configured to be the read voltage $V_{shift-1}$, and the read voltages $V_1$, $V_2$, $V_4$, and $V_5$ are configured according to the read voltage $V_{shift-1}$.

In another exemplary embodiment, the first decoding operation and the second decoding operation both belong to the hard-bit mode decoding. For instance, in FIG. 7A, after the second read command sequence is received, the RNVM module 406 may use the read voltage $V_{shift-1}$ to read the first memory cells for obtaining the second data, wherein the second data includes hard bits used in the second decoding operation. However, the details about the operation of reading the first data and first decoding operation are described in detail in the above, and will not be repeated herein. In addition, in another exemplary embodiment, the first decoding operation and/or the second decoding operation can also be the decoding operations belonging to the algorithm such as the BCH code or the block turbo code.

In the read voltage level coarse adjustment operation of an exemplary embodiment, the MMC 602 obtains the total number (hereinafter referred to as first number) of memory cells meeting a default condition among the first memory cells according to the first data and determines the second read voltage level according to the first number. For instance, the MMC 602 may obtain the first number of memory cells meeting the default condition according to a first type data of the first data. According to the first number, the MMC 602 can roughly obtain a wear degree and/or the threshold voltage distribution of the first memory cells and accordingly obtaining the corresponding second read voltage level.

Figure 8:
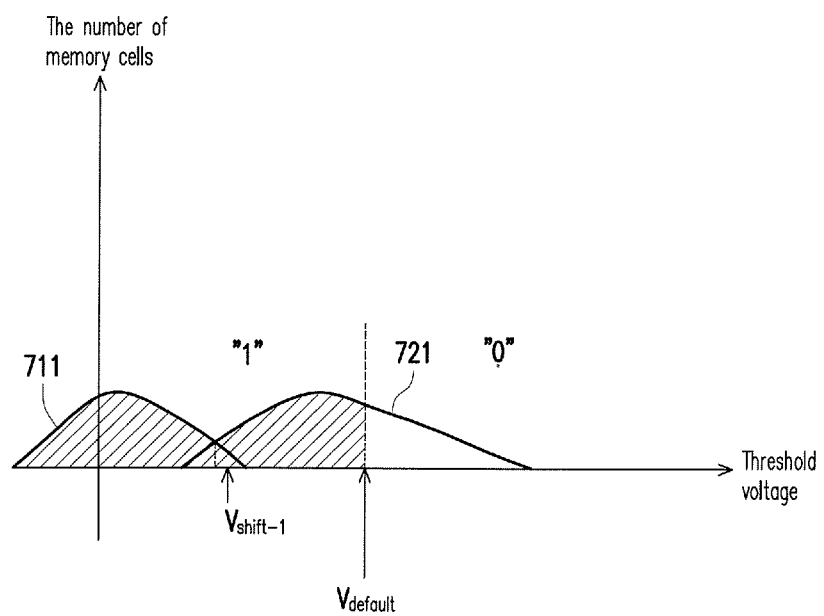
FIG. 8 is a schematic diagram illustrating the operation of estimating the channel status according to an exemplary embodiment of the disclosure.

FIG. 8 is a schematic diagram illustrating the operation of estimating the channel status according to an exemplary embodiment of the disclosure.

Please referring to FIG. 8, after the RNVM module 406 uses the read voltage $V_{default}$ to read the first memory cells and the first data is obtained, the MMC 602 can calculate the total number of bit "1" in the first data, wherein said total number equals to a total number (i.e., the first number) of memory cells among the first memory cells each having a threshold voltage lower than the read voltage $V_{default}$. Then, the MMC 602 can input the first number to a lookup table or an algorithm and determine the second read voltage level according to an output of the lookup table or the algorithm. In addition, after the performance degradation of the first memory cells occurs, the state 711 and state 721 become flatter and the left terminal of the state 721 is extended to the left direction. Therefore, the value of the first number obtained in correspondence with the usage of the read voltage $V_{default}$ is also increased. In the meanwhile, because the left terminal of the state 721 is extended to the left direction, the read voltage $V_{shift-1}$ is also shifted to the left correspondingly. In other words, in an exemplary embodiment, the value of the first number is positively correlated to the voltage difference value between the first read voltage level and the second read voltage level.

In an exemplary embodiment, the MMC 602 may obtain the ratio of the first number and the total number of the first memory cells and obtain the corresponding second read voltage level according to the ratio. For instance, the MMC 602 can also input the ratio of the first number and the total number of the first memory cells to a lookup table or an algorithm and determine the second read voltage level according to the output of the lookup table or the algorithm. In addition, in FIG. 8, for instance, if the channel status of the first memory cells gets worse, the first number is increased and the ratio of the first number and the total number of the first memory cells is increased, and the obtained read voltage $V_{shift-1}$ is also shifted to the left correspondingly. For instance, the following table 2 illustrates the correspondence relation of the ratio of the first number and the total number of the first memory cells and the offset value of the read voltage in an exemplary embodiment.

TABLE 2

| The ratio of the first number and the total number of the first memory cells | The offset value (mV) of the read voltage level |
| --- | --- |
| 0.55 | −12 |
| 0.60 | −37 |
| 0.65 | −54 |
| 0.70 | −63 |
| 0.75 | −77 |

According to table 2, if the ratio of the first number and the total number of the first memory cells is 0.55 (that is, the memory cells meeting the default condition accounts for 55% of the first memory cells), the MMC 602 can subtract 12 mV from the first read voltage level and obtain the second read voltage level; if the ratio of the first number and the total number of the first memory cells is 0.60 (that is, the memory cells meeting the default condition accounts for 60% of the first memory cells), the MMC 602 can subtract 37 mV from the first read voltage level and obtain the second read voltage level, and so on. However, table 2 is merely an example, the specific values in table 2 can all be adjusted according to the practical needs. In addition, the ratio of the first number and the total number of the first memory cells in table 1 can further be replaced by the first number or the total number of the error bits in the first data, and the corresponding offset value can be configured accordingly, the disclosure is not limited thereto.

In an exemplary embodiment, the MMC 602 can determine the second read voltage level according to part of the information (not all information) of the threshold voltage of first memory cells. For instance, in FIG. 7A or FIG. 8, the MMC 602 can roughly obtain the location of each peak of the state 711 and state 721 (e.g., the voltage corresponding to each peak of state 711 and state 721). According to the location of the peaks of the state 711 and state 721 and/or the distance between the peaks of state 711 and state 721, the MMC 602 can also roughly estimate the current channel status of the first memory cells and obtain the corresponding second read voltage level by method such as table searching.

In an exemplary embodiment, if the second decoding operation succeeds (for instance, all of the errors in the second data are corrected), the MMC 602 outputs the successfully decoded data. If the second decoding operation fails (for instance, not all of the errors in the second data are corrected), the MMC 602 performs an optimal read voltage level tracking operation to obtain an optimal read voltage level. For instance, compared to the second read voltage level determined according to the roughly estimated channel status, the optimal read voltage level is determined according to the actual channel status of the RNVM module 406 (or the first memory cell). For instance, in FIG. 7A, in an optimal read voltage level tracking operation, the actual channel status of the RNVM module 406 (or first memory cell) may be analyzed, and the read voltage $V_{shift-2}$ can be obtained precisely. In addition, compared to the read voltage $V_{shift-1}$, the read voltage $V_{shift-2}$ is shifted to the left even more. For instance, compared to the read voltage $V_{shift-1}$, the read voltage $V_{shift-2}$ may be much closer to the center position of the overlapping region 730. It is noted that although the read voltage level being shifted to the even left (that is, the read voltage $V_{shift-1}$ is less than the read voltage $V_{default}$) are used as examples in the above exemplary embodiments, however, the read voltage level can also be shifted to the right in other not mentioned exemplary embodiments (that is, the read voltage $V_{shift-1}$ may be greater than the read voltage $V_{default}$). In addition, the read voltage $V_{shift-2}$ can also be greater or less than the read voltage $V_{shift-1}$, the disclosure is not limited thereto.

After the optimal read voltage level is obtained, the MMC 602 transmits a read command sequence (hereinafter also referred to as third read command sequence) to the RNVM module 406, wherein the third read command sequence instructs the RNVM module 406 to read data (hereinafter also referred to as third data) from the first memory cells based on the optimal read voltage level. For instance, according to the third read command sequence, the RNVM module 406 uses the read voltage $V_{shift-2}$ to read the first memory cells and transmits the corresponding bit data to the MMC 602. After obtaining the third data, the ECCC 608 performs a decoding operation (hereinafter also referred to as third decoding operation) on the third data.

It is noted that the third data is obtained based on the optimal read voltage level, so the total number of the error bits in the third data is less than the total number of the error bits in the second data, and the success rate of the third decoding operation is higher than the success rate of the second decoding operation even more. On the other hand, before the optimal read voltage level tracking operation is performed, the used read voltage level (e.g. the second read voltage level) is already configured nearby the optimal read voltage level. For instance, in an exemplary embodiment in FIG. 7A, the voltage difference value between the read voltage $V_{shift-2}$ and the read voltage $V_{shift-1}$ may approach one or two offset value. Therefore, tracking the optimal read voltage level based on the second read voltage level can also shorten the time of the execution of the optimal read voltage level tracking operation.

In the exemplary embodiment, the third decoding operation belongs to the soft-bit mode decoding. For instance, in the third decoding operation, the channel reliability information can be used and can be updated. In addition, the third decoding operation can be performed repeatedly until the third decoding operation succeeds or the execution number of the third decoding operation reaches a predetermined number. However, in another exemplary embodiment, the third decoding operation can be the algorithm belonging to the hard-bit mode decoding, BCH code or the block turbo code, and so on, the disclosure is not limited thereto.

Figure 9:
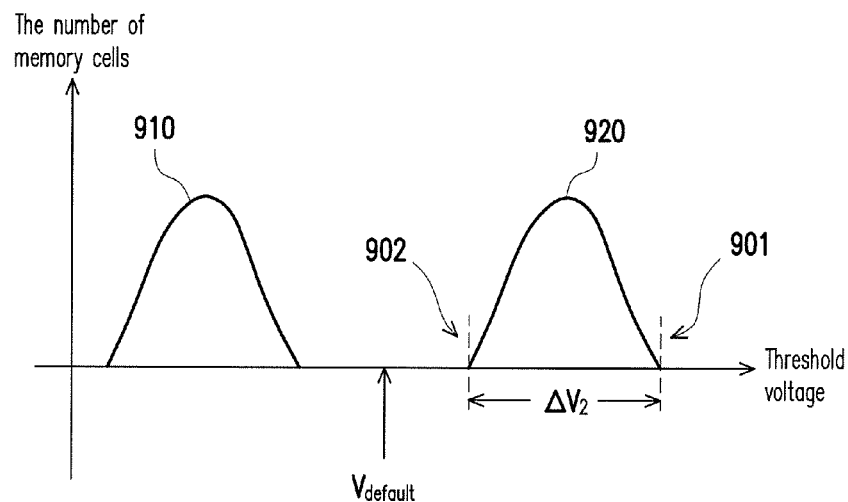
FIG. 9 is a schematic diagram illustrating a threshold voltage distribution of the memory cells according to another exemplary embodiment of the disclosure.
Figure 9:
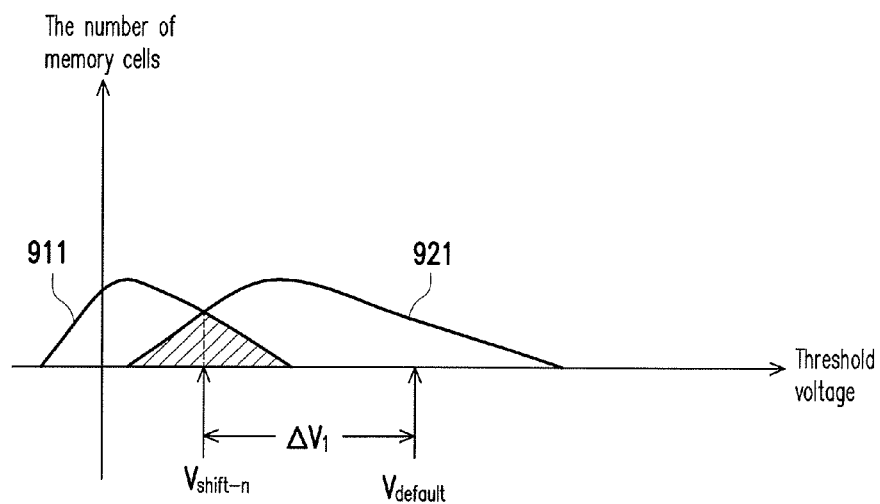

FIG. 9 is a schematic diagram illustrating a threshold voltage distribution of the memory cells according to another exemplary embodiment of the disclosure.

Please referring to FIG. 9, it is assumed that an initial threshold voltage distribution of the first memory cells includes state 910 and state 920, wherein state 910 corresponds to bit "1", for example, and state 920 corresponds to bit "0", for example, and the read voltage $V_{default}$ represents a predetermined read voltage level corresponding to the initial threshold voltage distribution. After the occurrence of a serious performance degradation, the threshold voltage distribution of the first memory cells includes state 911 and state 921, wherein state 911 corresponds to bit "1", for example, and state 921 corresponds to bit "0", for example, and the read voltage $V_{shift\text{-}n}$ represents an optimal read voltage level corresponding to the state 911 and state 921. For instance, in correspondence with the state 911 and state 921, the performed optimal read voltage level tracking operation can find the read voltage $V_{shift\text{-}n}$.

In an exemplary embodiment, if the read voltage $V_{shift\text{-}n}$ is used to read the data from the first memory cells, and the total number of the error bits included in the read data approaches an error bit number corresponding to the maximum error correction capability of the ECCC 608, then the read voltage $V_{shift\text{-}n}$ can be considered to be a threshold read voltage level corresponding to the first memory cell and/or the ECCC 608. For instance, if the error bit number corresponding to the maximum error correction capability of the ECCC 608 is "N", it indicates that in the data read from the first memory cells, the ECCC 608 can correct N error bit at most. In other words, in the operation of the memory storage device 10, when the read voltage $V_{shift\text{-}n}$ is used, it indicates that the first memory cells is going to be not available (because the read data is likely to include error which can't be corrected).

In an exemplary embodiment, by analyzing the threshold voltage distribution of the RNVM module 406 (or the first memory cells) and the maximum error correction capability of the ECCC 608, the read voltage $V_{shift\text{-}n}$ can be determined before the memory storage device 10 leaving the factory. In the meanwhile, a voltage difference value (also referred to as first voltage difference value) $\Delta V_1$ between the read voltage $V_{default}$ and the read voltage $V_{shift\text{-}n}$ can be measured, and a voltage difference value (also referred to as second voltage difference value) $\Delta V_2$ between an upper terminal 901 (also referred to as threshold voltage upper terminal) and a lower terminal 902 (also referred to as threshold voltage lower terminal) corresponding to the state 920 can also be measured. According to the measured results, the first voltage difference value $\Delta V_1$ is greater than or equal to half of the second voltage difference value $\Delta V_2$ (that is, $\Delta V_1 \ 0.5 \times \Delta V_2$). In an exemplary embodiment, the characteristic of the first voltage difference value $\Delta V_1$ being greater than or equal to the half of the second voltage difference value $\Delta V_2$ is (only) shown in the RNVM module 406 having the three-dimensional memory cell array (for instance, the memory cell array 520 in FIG. 5B).

Figure 10:
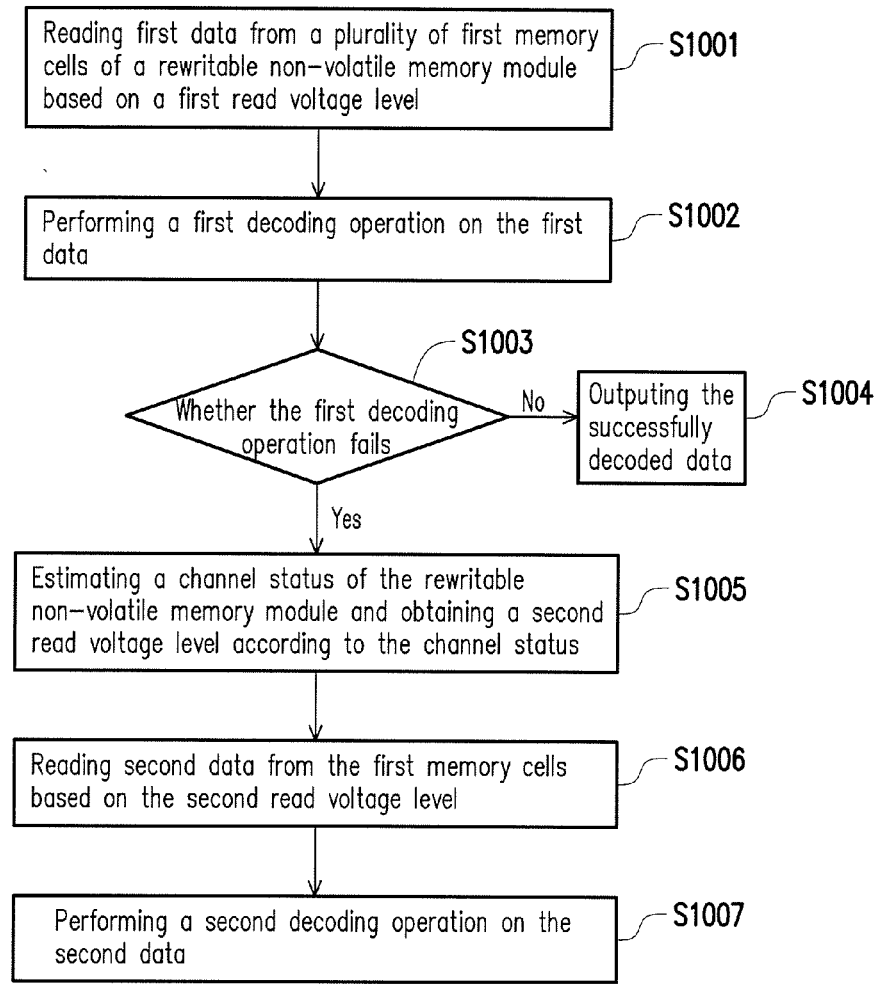
FIG. 10 is a schematic diagram illustrating a decoding method according to an exemplary embodiment of the disclosure.

FIG. 10 is a schematic diagram illustrating a decoding method according to an exemplary embodiment of the disclosure.

Please referring to FIG. 10, in step S1001, the first data is read from a plurality of first memory cells of the RNVM module based on a first read voltage level. In step S1002, the first decoding operation is performed on the first data. In step S1003, it is determined that whether the first decoding operation fails. If the first decoding operation dose not fail (that is, succeed), the successfully decoded data is output in step S1004. If the first decoding operation fails, in step S1005, the channel status of the RNVM module is estimated and a second read voltage level is obtained according to the estimated channel status, wherein the second read voltage level is different from the first read voltage level, and the second read voltage level is different from an optimal read voltage level. In step S1006, the second data is read from the first memory cells based on the second read voltage level. In step S1007, the second decoding operation is performed on the second data.

Figure 11A:
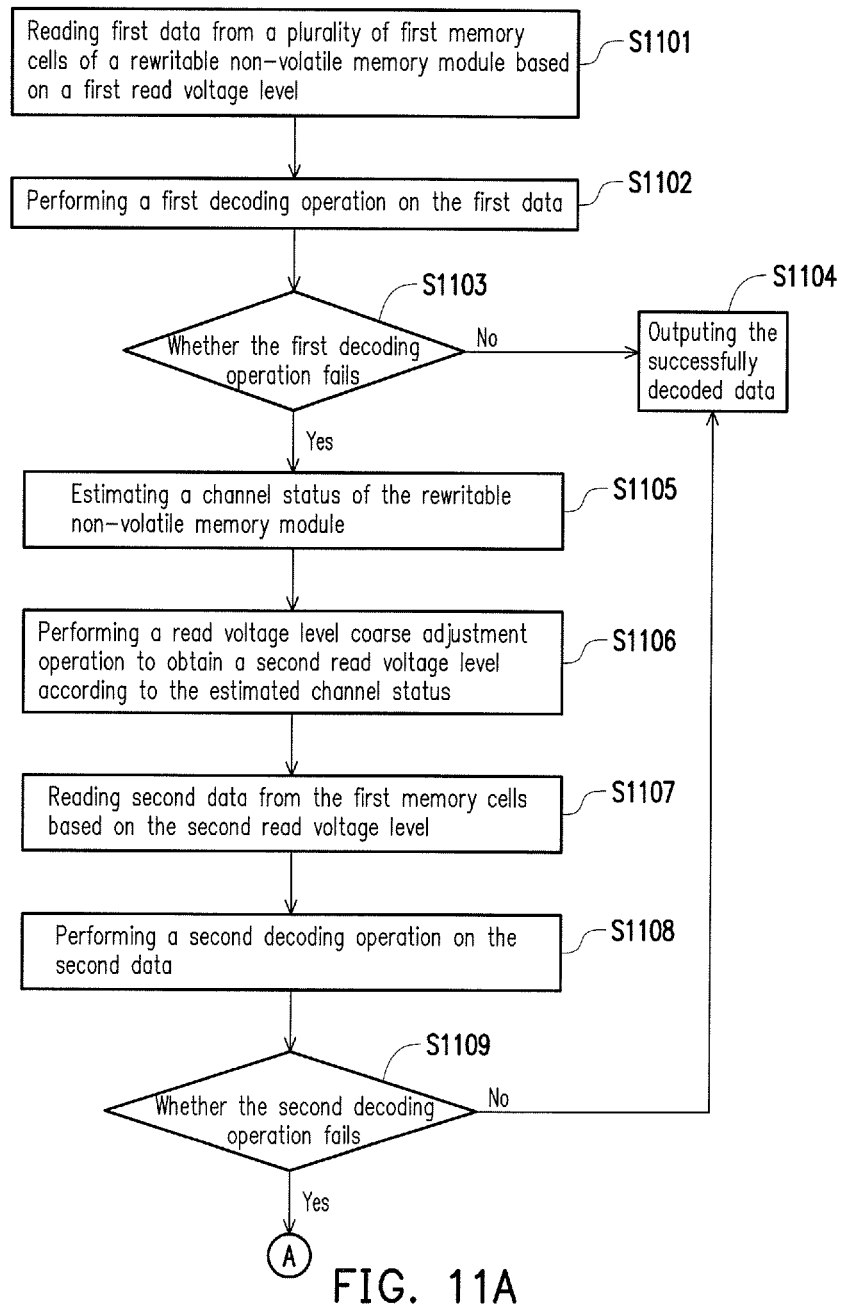
FIG. 11A and FIG. 11B are schematic diagrams illustrating a decoding method according to an exemplary embodiment of the disclosure.
Figure 11B:
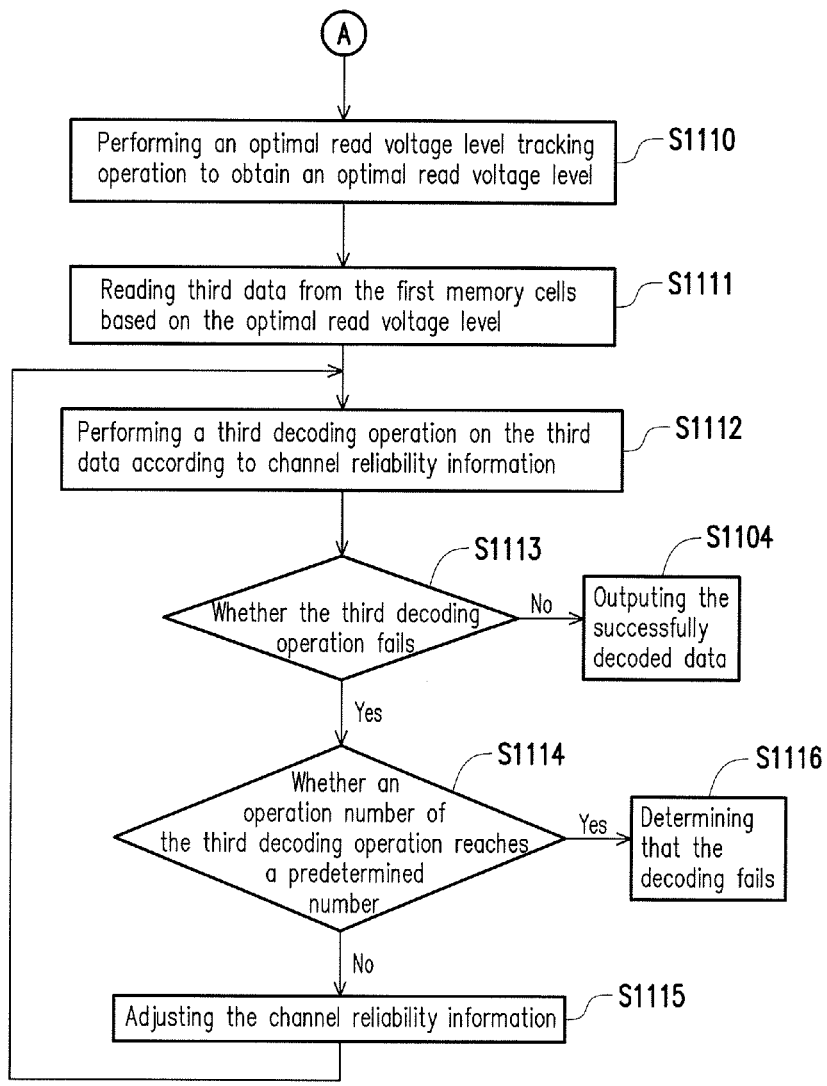

FIG. 11A and FIG. 11B are schematic diagrams illustrating a decoding method according to an exemplary embodiment of the disclosure.

Please referring to FIG. 11A, in step S1101, the first data is read from a plurality of first memory cells of the RNVM module based on a first read voltage level. In step S1102, the first decoding operation is performed on the first data. In step S1103, it is determined that whether the first decoding operation fails. If the first decoding operation dose not fail (that is, succeed), the successfully decoded data is output in step S1104. If the first decoding operation fails, in step S1105, the channel status of the RNVM module is estimated. In step S1106, a read voltage level coarse adjustment operation is performed according to the estimated channel status to obtain the second read voltage level, wherein the second read voltage level is different from the first read voltage level, and the second read voltage level is different from the optimal read voltage level. In step S1107, the second data is read from the first memory cells based on the second read voltage level. In step S1108, the second decoding operation is performed on the second data. For instance, the second decoding operation may be performed according to a predetermined channel reliability information. For instance, the predetermined channel reliability information may be recorded in the 0-th LLR table (also referred to as a predetermined LLR table). In step S1109, it is determined that whether the second decoding operation fails. If the second decoding operation dose not fail (that is, succeed), the successfully decoded data is output in step S1104. If the second decoding operation fails, proceeds to step S1110.

Please referring to FIG. 11B, in step S1110, an optimal read voltage level tracking operation is performed to obtain the optimal read voltage level. In step S1111, the third data is read from the first memory cells based on the optimal read voltage level. In step S1112, the third decoding operation is performed on the third data according to the channel reliability information. For example, the channel reliability information can be obtained from the i-th LLR table, where i is a positive integer. In step S1113, it is determined that whether the third decoding operation fails. If the third decoding operation dose not fail (that is, succeed), the successfully decoded data is output in step S1104. If the third decoding operation fails, in step S1114, it is determined that whether the execution number of the third decoding operation reaches a predetermined number. If the execution number of the third decoding operation does not reach the predetermined number, in step S1115, the channel reliability information is adjusted (or updated). For example, the updated channel reliability info' nation can be obtained from the (i+1)-th LLR table instead. After step S1115, the step S1112 can be performed repeatedly, and the third decoding operation is performed on the third data according to the adjusted channel reliability information again. In addition, if it is determined to be "yes" (for instance, all of the LLR tables are used up) in step S1114, then proceeds to step S1116, and the decoding is determined to be unsuccessful or fails.

Each step in FIG. 10, FIG. 11A, and FIG. 11B has been specified as above and thus is not repeated hereinafter. It is noted that, the steps depicted in FIG. 10, FIG. 11A, and FIG. 11B may be implemented as a plurality of program codes or circuits, which are not particularly limited in the disclosure. Moreover, the methods disclosed in FIG. 10, FIG. 11A, and FIG. 11B may be implemented with reference to above embodiments, or may be implemented separately, which are not particularly limited in the disclosure.

Based on the above, when the first data is read based on the first read voltage level and the first decoding operation performed on the first data fails, the second read voltage level different from the first read voltage level can be obtained according to the roughly estimated channel status of the RNVM module, and the second read voltage level is different from the optimal read voltage level. Then, the second data is read based on the second read voltage level and the second decoding operation is performed. Compared to normal decoding method which blindly tests various read voltages by searching the table or directly performs the optimal read voltage tracking operation after a decoding fails, the disclosure can significantly increase the success rate of the second decoding operation without overly extending the time spent on searching the second read voltage level, so as to increase the overall decoding efficiency. Specifically, in the exemplary embodiment which the RNVM module has the three-dimensional memory cell structure, the decoding efficiency of the memory storage device can further be increased.

The previously described exemplary embodiments of the present disclosure have the advantages aforementioned, wherein the advantages aforementioned not required in all versions of the disclosure.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A decoding method for a rewritable non-volatile memory module comprising a plurality of memory cells, the decoding method comprising:
    reading first data from a plurality of first memory cells among the plurality of memory cells based on a first read voltage level;
    performing a first decoding operation on the first data;
    estimating a channel status of the rewritable non-volatile memory module and obtaining a second read voltage level according to the channel status if the first decoding operation fails, wherein the second read voltage level is different from the first read voltage level, and the second read voltage level is different from an optimal read voltage level;
    reading second data from the plurality of first memory cells based on the second read voltage level; and
    performing a second decoding operation on the second data.

2. The decoding method of claim 1, wherein the step of estimating the channel status of the rewritable non-volatile memory module and obtaining the second read voltage level according to the channel status comprises:
    obtaining a first number of a memory cell among the plurality of first memory cells meeting a default condition; and
    determining the second read voltage level according to the first number.

3. The decoding method of claim 2, wherein the step of obtaining the first number of the memory cell among the plurality of first memory cells meeting the default condition comprises:
    obtaining the first number of the memory cell among the plurality of first memory cells meeting the default condition according to a first type data of the first data.

4. The decoding method of claim 2, wherein the step of determining the second read voltage level according to the first number comprises:
    obtaining a ratio of the first number and a total number of the plurality of first memory cells; and
    determining the second read voltage level according to the ratio.

5. The decoding method of claim 2, wherein a value of the first number is positively correlated to a voltage difference value between the first read voltage level and the second read voltage level.

6. The decoding method of claim 1, further comprising:
    performing an optimal read voltage level tracking operation to obtain the optimal read voltage level if the second decoding operation fails;
    reading third data from the plurality of first memory cells based on the optimal read voltage level, wherein a total number of an error bit of the third data is less than a total number of an error bit of the second data; and
    performing a third decoding operation on the third data.

7. The decoding method of claim 1, wherein the decoding method is adapted to the rewritable non-volatile memory module having a three-dimensional memory cell array.

8. The decoding method of claim 1, wherein a first voltage difference value between a threshold read voltage level of the rewritable non-volatile memory module and a predetermined read voltage level of the rewritable non-volatile memory module is greater than half of a second voltage difference value,
    wherein the second voltage difference value is a voltage difference value between a threshold voltage upper terminal and a threshold voltage lower terminal corresponding to a state of an initial threshold voltage distribution of the plurality of first memory cells,
    wherein a total number of an error hit comprised by data read from the plurality of first memory cells based on the threshold read voltage level approaches an error bit number corresponding to a maximum error correction capability of a memory control circuit unit for controlling the rewritable non-volatile memory module.

9. A memory storage device, comprising:
    a connection interface unit, configured to couple to a host system;
    a rewritable non-volatile memory module, comprising a plurality of memory cells; and
    a memory control circuit unit, coupled to the connection interface unit and the rewritable non-volatile memory module,
    wherein the memory control circuit unit is configured to transmit a first read command sequence which instructs reading first data from a plurality of first memory cells among the plurality of memory cells based on a first read voltage level,
    wherein the memory control circuit unit is further configured to perform a first decoding operation on the first data,
    wherein the memory control circuit unit is further configured to estimate a channel status of the rewritable non-volatile memory module and obtaining a second read voltage level according to the channel status if the first decoding operation fails, wherein the second read voltage level is different from the first read voltage level, and the second read voltage level is different from an optimal read voltage level,
    wherein the memory control circuit unit is further configured to transmit a second read command sequence which instructs reading second data from the plurality of first memory cells based on the second read voltage level,
    wherein the memory control circuit unit is further configured to perform a second decoding operation on the second data.

10. The memory storage device of claim 9, wherein the operation of the memory control circuit unit estimating the channel status of the rewritable non-volatile memory module and obtaining the second read voltage level according to the channel status comprises:
  obtaining a first number of a memory cell among the plurality of first memory cells meeting a default condition; and
  determining the second read voltage level according to the first number.

11. The memory storage device of claim 10, wherein the operation of the memory control circuit unit obtaining the first number of the memory cell among the plurality of first memory cells meeting the default condition comprises:
  obtaining the first number of the memory cell meeting the default condition according to a first type data of the first data.

12. The memory storage device of claim 10, wherein the operation of the memory control circuit unit determining the second read voltage level according to the first number comprises:
  obtaining a ratio of the first number and a total number of the plurality of first memory cells; and
  determining the second read voltage level according to the ratio.

13. The memory storage device of claim 10, wherein a value of the first number is positively correlated to a voltage difference value between the first read voltage level and the second read voltage level.

14. The memory storage device of claim 9, wherein the memory control circuit unit is further configured to perform an optimal read voltage level tracking operation to obtain the optimal read voltage level if the second decoding operation fails,
  wherein the memory control circuit unit is further configured to transmit a third read command sequence which instructs reading third data from the plurality of first memory cells based on the optimal read voltage level, wherein a total number of an error bit of the third data is less than a total number of an error bit of the second data,
  wherein the memory control circuit unit is further configured to perform a third decoding operation on the third data.

15. The memory storage device of claim 9, wherein the rewritable non-volatile memory module has a three-dimensional memory cell array.

16. The memory storage device of claim 9, wherein a first voltage difference value between a threshold read voltage level of the rewritable non-volatile memory module and a predetermined read voltage level of the rewritable non-volatile memory module is greater than half of a second voltage difference value,
  wherein the second voltage difference value is a voltage difference value between a threshold voltage upper terminal and a threshold voltage lower terminal corresponding to a state of an initial threshold voltage distribution of the plurality of first memory cells,
  wherein a total number of an error bit comprised by data read from the plurality of first memory cells based on the threshold read voltage level approaches an error bit number corresponding to a maximum error correction capability of the memory control circuit unit.

17. A memory control circuit unit, for controlling a rewritable non-volatile memory module comprising a plurality of memory cells, wherein the memory control circuit unit comprises:
  a host interface coupled to a host system;
  a memory interface, configured to couple to the rewritable non-volatile memory module;
  an error checking and correcting circuit; and
  a memory management circuit, coupled to the host interface, the memory interface and the error checking and correcting circuit,
  wherein the memory management circuit is configured to transmit a first read command sequence which instructs reading first data from a plurality of first memory cells among the plurality of memory cells based on a first read voltage level,
  wherein the error checking and correcting circuit is configured to perform a first decoding operation on the first data,
  wherein the memory management circuit is further configured to estimate a channel status of the rewritable non-volatile memory module and obtaining a second read voltage level according to the channel status if the first decoding operation fails, wherein the second read voltage level is different from the first read voltage level, and the second read voltage level is different from an optimal read voltage level,
  wherein the memory management circuit is further configured to transmit a second read command sequence which instructs reading second data from the plurality of first memory cells based on the second read voltage level,
  wherein the error checking and correcting circuit is further configured to perform a second decoding operation on the second data.

18. The memory control circuit unit of claim 17, wherein the operation of the memory management circuit estimating the channel status of the rewritable non-volatile memory module and obtaining the second read voltage level according to the channel status comprises:
  obtaining a first number of a memory cell among the plurality of first memory cells meeting a default condition; and
  determining the second read voltage level according to the first number.

19. The memory control circuit unit of claim 18, wherein the operation of the memory management circuit obtaining the first number of the memory cell among the plurality of first memory cells meeting the default condition comprises:
  obtaining the first number of the memory cell meeting the default condition according to a first type data of the first data.

20. The memory control circuit unit of claim 18, wherein the operation of the memory management circuit determining the second read voltage level according to the first number comprises:
  obtaining a ratio of the first number and a total number of the plurality of first memory cells; and
  determining the second read voltage level according to the ratio.

21. The memory control circuit unit of claim 18, wherein a value of the first number is positively correlated to a voltage difference value between the first read voltage level and the second read voltage level.

22. The memory control circuit unit of claim 17, wherein the memory management circuit is further configured to perform an optimal read voltage level tracking operation to obtain the optimal read voltage level if the second decoding operation fails,
  wherein the memory management circuit is further configured to transmit a third read command sequence which instructs reading third data from the plurality of first memory cells based on the optimal read voltage level, wherein a total number of an error bit of the third data is less than a total number of an error bit of the second data, wherein the error checking and correcting circuit is further configured to perform a third decoding operation on the third data.

23. The memory control circuit unit of claim 17, wherein the rewritable non-volatile memory module has a three-dimensional memory cell array.

24. The memory control circuit unit of claim 17, wherein a first voltage difference value between a threshold read voltage level of the rewritable non-volatile memory module and a predetermined read voltage level of the rewritable non-volatile memory module is greater than half of a second voltage difference value, wherein the second voltage difference value is a voltage difference value between a threshold voltage upper terminal and a threshold voltage lower terminal corresponding to a state of an initial threshold voltage distribution of the plurality of first memory cells, wherein a total number of an error bit comprised by data read from the plurality of first memory cells based on the threshold read voltage level approaches an error bit number corresponding to a maximum error correction capability of the error checking and correcting circuit.

* * * * *